Oct. 20, 1970 C. W. MOONEY 3,535,175

PROCESS FOR CHEMICALLY MACHINING AN ELECTROMECHANICAL FREQUENCY RESPONSIVE TRANSLATING DEVICE

Filed Aug. 5, 1968 2 Sheets-Sheet 1

INVENTOR
CHARLES W. MOONEY

BY Mueller, Aichele & Rauner
ATTORNEYS.

INVENTOR
CHARLES W. MOONEY
BY Mueller, Aichele & Rauner
ATTORNEYS.

United States Patent Office 3,535,175

Patented Oct. 20, 1970

3,535,175

PROCESS FOR CHEMICALLY MACHINING AN ELECTROMECHANICAL FREQUENCY RESPONSIVE TRANSLATING DEVICE

Charles W. Mooney, Wheeling, Ill., assignor to Motorola, Inc., Franklin Park, Ill., a corporation of Illinois Continuation-in-part of application Ser. No. 612,599, Jan. 30, 1967. This application Aug. 5, 1968, Ser. No. 750,043

Int. Cl. C23f 1/02

U.S. Cl. 156—11 2 Claims

ABSTRACT OF THE DISCLOSURE

A process for chemically machining an electromechanical frequency responsive device. including a vibrating reed having support and actuating portions, from a piece of sheet metal having a thin cross-section. Initially, a resist pattern corresponding to the device is deposited on the sheet metal, leaving exposed one side of the reed. The exposed metal is etched away reducing the thickness of the reed compared to the support and actuating portions.

CROSS REFERENCE TO RELATED INVENTIONS

This application is a continuation-in-part of application Ser. No. 612,599, filed Jan. 30, 1967, now U.S. 3,430,171 and assigned to the assignee of this application.

BACKGROUND OF THE INVENTION

This invention pertains generally to a process for making an electromechanical frequency responsive device.

With the use of transistors and integrated circuits in almost all electronic products, the size of any particular device is limited mainly by its mechanical components. For this reason, it is desirable to reduce the size of the vibrating reed in electromechanical frequency responsive devices. In fact, it is desirable to reduce these to the extent that the largest dimension is under 1" in size. Reeds generally used for this type of device in the past have been mainly stamped, and machined to the desired thickness. However, miniaturization of these reeds has made it impractical to mechanically machine the same. Furthermore, since the material from which the reeds are machined generally is cold drawn, the surfaces of the metal are prestressed which can cause frequency shifting as the surfaces of the reed become stress relieved during operation.

SUMMARY OF THE INVENTION

It is an object of this invention to provide a unique process for making a vibrating reed member for use in an electromechanical frequency responsive device.

It is a further object of this invention to provide a vibrating reed for use in electromechanical frequency responsive devices, which is chemically machined.

It is a further object of this invention to provide a reed for use with electromechanical frequency responsive devices, which is stress relieved prior to operation of the reed.

In one embodiment of this invention, a first pattern of resist is formed on one side of a sheet of metal having a thin cross section. The pattern of resist corresponds to the configuration of the electromechanical frequency responsive device having a vibrating member and supporting and actuating portions. A pattern of resist is formed on the other side of the sheet corresponding to the supporting and actuating portions, and exposing one side of the vibrating member. The exposed metal including one side of the vibrating member is etched away, and the device is washed to remove the resist. This results in a completed device having a vibrating member with a thickness less than the thickness of the supporting and actuating portions thereof, and which is stress relieved on one side.

DETAILED DESCRIPTION

Figures 1, 2, 3:
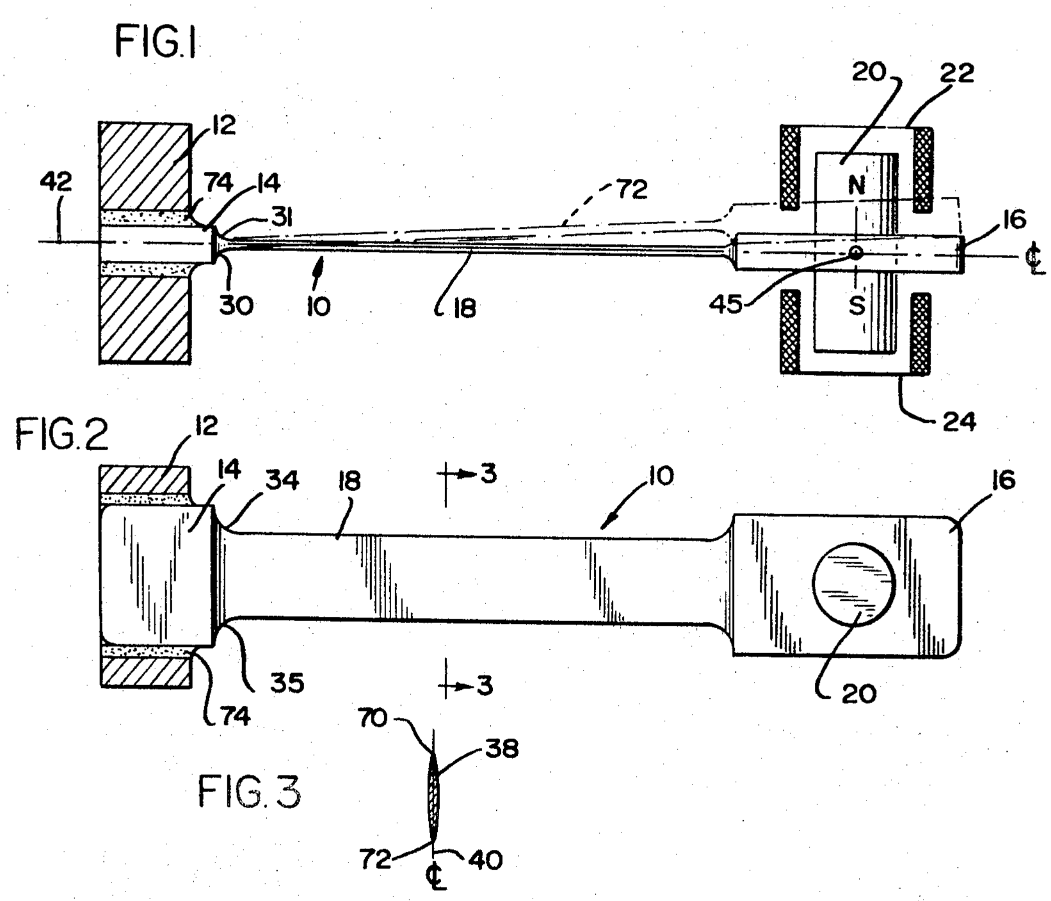
FIG. 1 is a side elevation view partly in cross section of an electromechanical frequency responsive device made in accordance with the principles of this invention.
FIG. 2 is a top plan view of the device of FIG. 1.
FIG. 3 is a cross section taken along the line 3—3 of FIG. 2.

In the drawings, cantilever-type reed 10 for use in an electromechanical frequency responsive device is shown greatly enlarged to make the details of the construction more easily understood. In devices actually constructed in which this type of reed may be used, the maximum dimension is on the order of one inch. Referring now more particularly to the drawing, the reed 10 is secured by brazing to a reed block 12. Reed 10 has an increased thickness at the end 14 which is fixed in the reed block and at the free end 16 so that the required strength is provided at the ends of the body portion 18 of the reed. The reed is designed so that it is resonant at some predetermined frequency.

Free end 16 of the reed has an elongated cylindrical permanent magnet 20 mounted therein. The magnet 20 extends through a hole in the free end 16 of the reed 10 and is mounted transversely thereof. The magnet serves as an armature for both driving and sensing the vibrations of reed 10 at the resonant frequency.

A pair of inductance windings 22 and 24 are mounted in a suitable fashion for driving and sensing vibrations in reed 10. Electrical signals at a predetermined frequency when applied to coil 24 displace the magnet to drive the reed into vibration, the second coil 22 senses the mechanical vibrations of the reed to produce electrical signals at a predetermined frequency. These electrical signals may be used in a feedback circuit to sustain oscillations, as in a selected signal transmitter, or in another application they may be used to open a selected signaling receiver circuit to reproduce a transmitted signal accompanying signals of a predetermined frequency. For a more detailed description of an electromechanical frequency translating device which operates using these principles, one may refer to a patent to Mooney et al. 3,221,120 issued Nov. 30, 1965.

The reed member 10 in accordance with this particular embodiment was chemically machined from both sides of a strip of Ni Span C nickel alloy which is a trademark of International Nickel Corporation. In one example, an 8 x 12 inch strip .014 to .015 inch thick was used from which a great number of reeds were made. The reed member 10 was made approximately .625 inch long by .003 inch thick at the body portion 18, with the end portions 14 and 16 being .092 inch wide and having a thickness equal to the thickness of the sheet. By being able to chemically machine the reeds from both sides of the sheet material certain geometric configurations are available which were not feasible prior to chemical machining. It should be clear, of course, that the dimensions given for this particular embodiment are for illustrative purposes only and are not meant to limit the application in any manner.

Referring more closely to FIG. 1, it can be seen that fillets or radii such as 30, 31 and 34, 35 (FIG. 2) form a transition between the body portion 18 of the reed 10 and the enlarged portion 14 at the fixed end of the reed 10. Furthermore, by machining the reed from both sides of the original flat plate, a cross-section is obtained which is elliptical in configuration as shown at 38 in FIG. 3. The ellipse 38 has a major axis 40 which lies in the plane containing the neutral axis or center line 42 (FIG. 1) of the reed 10. In addition the reed is machined so that the enlarged portion 16 at the free end is symmetrical about the center line 42. Therefore, the center of gravity of the reed 10 and the magnet 20 as shown at 45 lies on the neutral axis 42 of the reed 10.

Figure 4:
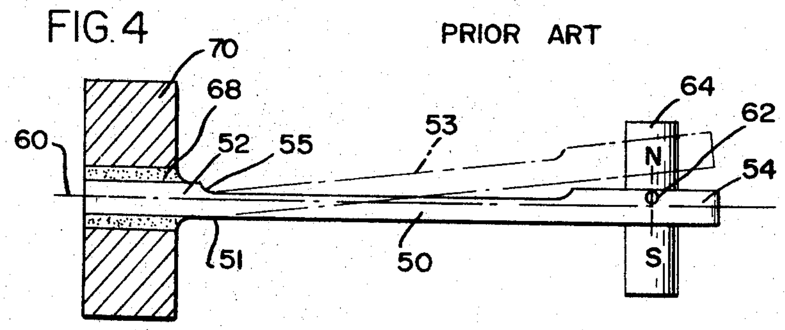
FIG. 4 PRIOR ART
FIG. 4 is a side elevation view partially in cross section of a prior art electromechanical frequency responsive device which was made by mechanical machining methods.
Figure 6:
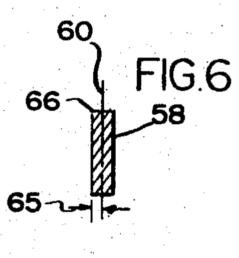
FIG. 6 is a cross section taken along the line 6—6 of the prior art device of FIG. 5.
Figure 5:
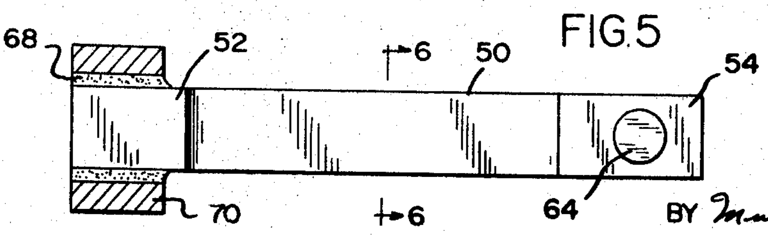
FIG. 5 is a top plan view of the prior art device of FIG. 4.

The significance of this structure can be more clearly understood by referring to FIGS. 4–6 which illustrate a reed device made under previously used mechanical machining methods. In making these devices a flat sheet of metal is machined from one side to make the thin body portion 50 which is intermediate the enlarged fixed end portion 52 and free end portion 54. In this device, fillets on one side only, such as shown at 55, form the transition from the thin body portion 50 to the fixed end portion 52 of the reed. Because the other side is not machined, the transition is flat surface 51 from the body portion 50 to the end portion 52. Equally significant is the fact that the cross-section of the body portion 50 as shown in FIG. 6 is a rectangle 58. Finally, the reed is not machined symmetrical about the neutral axis 60 of the reed device so that the center of gravity 62 of the reed and magnet 64 is offset from the neutral or center line 60.

It should be apparent to those skilled in the art that the greater the distance from the neutral axis 60 the greater the stress level within the body portion 50. By referring to FIG. 6 such as at 65 it can be seen that the greatest stress concentrations in the prior art device are at the four sharp edges of the rectangular cross-section 66 for instance. This is undesirable because any notches or scratches at these sharp edges will be subjected to maximum stress during operation of the device and will eventually cause a fatigue fracture with subsequent failure. Referring to the elliptical cross-section 38 of the reed 10, however, one can see how this problem has been alleviated. By making the cross-section elliptical in shape and placing the major axis of the ellipse in the plane of the center line 42 of the reed 10, the two sharp edges 70 and 72 of the body portion 18 lie on the neutral axis of the reed 10 and therefore theoretically at points of zero stress during the time that the reed is being vibrated, and the maximum stress levels fall on the smooth curved outer surface. Therefore, notches or scratches or nicks at the edges will not eventually result in fatigue failure of the reed device. Because all stress concentrations at the edges of the device have been virtually eliminated, the fatigue life of the reed device has been greatly extended.

Referring once again to the prior art device, because the body poriton 50 was machined so that there were fillets on only one side such as 55, when the reed is excited into vibration as shown by 53, the outer fibers on the opposite side of the reed at 51 are elongated stressing the brazing alloy 68 which is used to secure the end 52 to the reed block 70. The stress on the brazing alloy 68 is a factor which contributes to the resonant frequency of the overall device. It is possible to select the reed material to have a constant thermal expansion coefficient so that the resonant frequency will remain the same for temperature variations. However, the brazing alloy has poor temperature characteristics and because the alloy is a factor in the resonant frequency of the device, temperature changes in the alloy will cause the frequency of the device to shift. In the reed 10 of this invention, however, by machining the reed on both sides so that the fillets 30, 31 and 34, 35 form a transition from the thin body portion 18 to the enlarged fixed end 14 this problem has been eliminated. When the reed 10 is vibrated to a position shown in phantom at 72, the fillets or radii act as stress reliefs so that relatively little or no stress is applied to the brazing alloy 74. Therefore, the brazing alloy will have very little effect on the resonant frequency of the reed 10 so that temperature changes will have little affect on the frequency, providing the reed is made of a material that has a constant thermoexpansion coefficient. By relieving the strain to reduce the affect of the brazing alloy on the resonant frequency of the reed, the mechanical efficiency or Q of the device is improved, mainly, because the Q of the reed is generally greater than the Q of the brazing material.

Because the metal sheets from which the reeds are made are usually cold drawn both sides of the sheet material are prestressed. In the prior art device, machining on one side of the plate to form the reed configuration reduces the stress level on that side. However, the unmachined side of the reed still remains stressed. After the reed has been in operation for some time, the vibrations relieve the stress on the unmachined side causing a frequency shift. In the reed device 10 of this invention, however, by chemically machining the reed on both sides the residual stress levels are lowered to a point that frequency shift due to time of operation of the device is almost completely eliminated.

Machining the prior art reed only on one side also causes the center of gravity 62 to be offset from the neutral axis 60 of the reed. This causes the reed to become unbalanced so that as the reed vibrates gravity will act on the free end 54 to cause some frequency shifting due to gravity. By making the free end 16 of the reed 10 symmetrical about the neutral axis, the center of gravity 45 of the reed and magnet falls in the plane of the neutral axis 16. Therefore, the reed is balanced so that as it vibrates gravity will have little or no affect on the resonant frequency of the device 10 so that frequency shift due to gravity is virtually eliminated.

Figure 7:
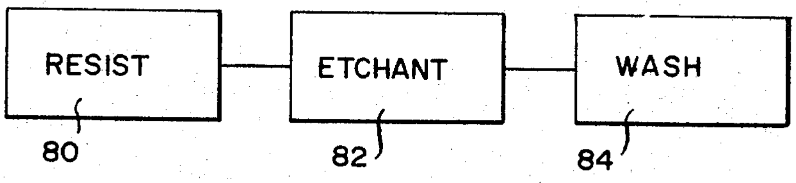
FIG. 7 is a block diagram illustrating the steps of one embodiment of the process in accordance with this invention.
Figure 8:
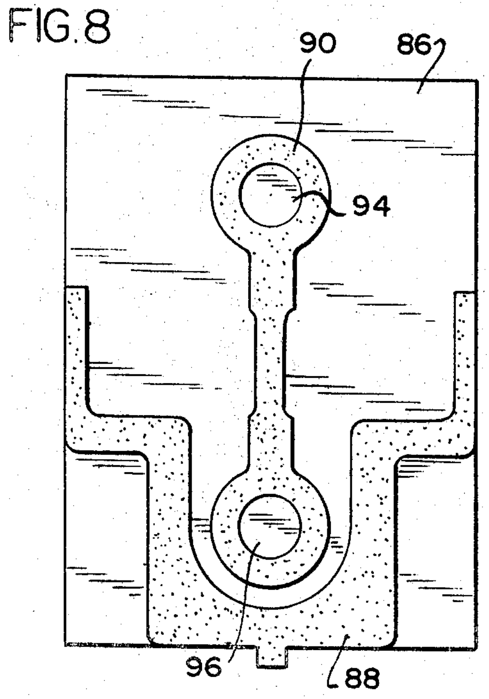
FIG. 8 is a top plan view illustrating a resist pattern formed in accordance with this invention.
Figure 9:
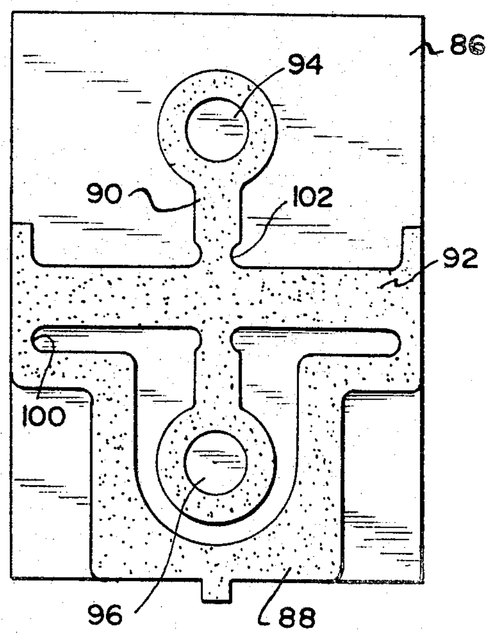
FIG. 9 is a bottom plan view of the device shown in FIG. 8.
Figure 10:
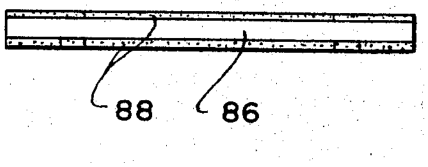
FIG. 10 is an end view of the device of FIG. 8.
Figure 11:
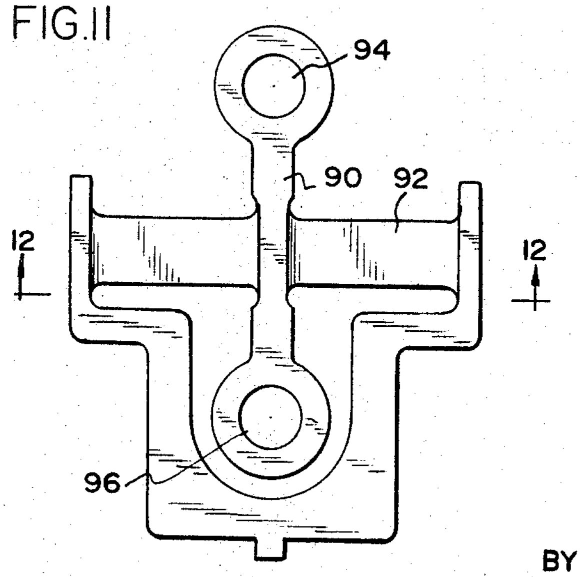
FIG. 11 is a top plan view of a device made in accordance with the process of this invention.

The chemical milling process previously discussed is outlined in FIG. 7 of the drawing. The process includes forming a pattern of resist 80 on a sheet of metal having a thin cross-section, such as by well known photographic or silk screening processes. The exposed metal is etched away 82 after application of the resist so that only the frequency responsive device remains, and subsequently, the resist is washed 84 from the device.

FIGS. 8–12 illustrate an electromechanical frequency responsive device made in accordance with the process set forth in FIG. 7. In this device, a sheet of metal 86, such as Elinvar Extra sold by Hamilton Watch Company, of Lancaster, Pa., having a thin cross-section on the order of .012" thick, for instance, is provided. Subsequently, a resist material, for instance, Kmer metal etch resist sold by Kodak, is applied by one of many known processes, such as the photographic process, to one side of the sheet (FIG. 9), in a pattern corresponding to the configuration of the device, which includes a reed or vibrating member 92, a supporting portion 88 for the reed, and an actuating portion 90. The resist pattern on the other side of the sheet (FIG. 8), is similar to that shown in FIG. 9 with the exception that the metal surface of the reed 92 as shown in phantom is exposed.

The actuating portion 90 extends from the reed member 92, and in each end thereof the resist is formed in a pattern such that circular portions 94 and 96 are exposed.

Figure 12:
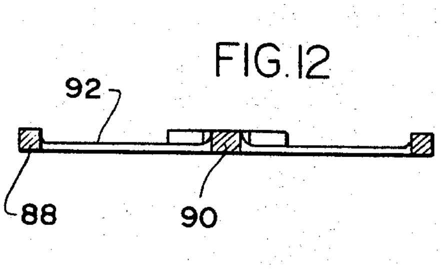
FIG. 12 is a cross-section along the line 12—12 of the device of FIG. 11.

In the next step, an etching substance such as ferric chloride is applied to the metal and it is etched away except where the resist pattern has been formed. Because the resist has been applied to only one side of the sheet metal corresponding to the reed member 92, the substance will etch away the metal on the exposed side of the reed so that the same is reduced in thickness compared to the supporting portion 88 and actuating portion 90, as shown in FIG. 12. Because the substances etches the metal plate from both sides, it is completely removed leaving only the configuration of the device as formed by the resist pattern. In addition, the circular portions 94 and 96 in the actuating portion 90 are likewise attacked from both sides during etching, resulting in apertures in each end of the actuating portion. Magnets are inserted through the aperture 94–96 in the completed device to provide actuating and sensing functions similarly to the function of the magnet described with the embodiment shown in FIGS. 1–3. As can be deduced from the configuration of the device in FIG. 11, the vibrating reed 92 is operated in a torsional vibration mode rather than the cantilever type operation of the device previously described.

The etching process, subsequent to forming the resist, provides fillets such as 100 and 102 between the reed 92 and the support portion 88 and actuating portion 90, respectively. Furthermore, etching of one side of the vibrating member 92 relieves a portion of the stresses in the reed.

The vibrating reed structure described in connection with FIGS. 1–3 is chemically milled using the aforementioned process in a modified form. To make that device, a first pattern of resist is formed on a metal sheet corresponding to the configuration of the reed 10. The exposed metal is etched away leaving the reed 10 in a form such as shown in FIG. 2, with the hole 20 extending through the free end or actuating portion 16 of the reed, and fillets 34 and 35 between the body portion 18 of the reed and the end or support portion 14 thereof. The device is washed to remove the resist, and a second pattern of resist is deposited on the device which covers the actuating portion 16 and the support portion 14 but which exposes the body portion 18 of the reed. The reed is then etched from both sides to a thickness less than the thickness of the actuating and support portions, thereby relieving the stesses therein. Subsequently, the completed device is washed to remove the remaining resist.

The electromechanical frequency responsive device, as described in FIGS. 8–12, can also be made using a two-step resist pattern such as described for the device in FIGS. 1–3. In this modification, the resist pattern corresponding to the configuration of the vibrating member 92 is deposited on the side shown in FIG. 8, as well as the other side of the sheet material. The exposed metal is then etched away and the resist removed. Subsequently, a second pattern of resist is formed on the support portion 88 and the actuating portion 90, leaving exposed both sides of the vibrating member 92. The vibrating member 92 is etched to a thickness less than the thickness of the support and actuating portions, thereby relieving the stresses on both sides of the vibrating member 92 and resulting in the benefits ascribed to the embodiment of FIGS. 1–3. Subsequently, the resist is washed from the device.

What has been described, therefore, is a unique process for chemically machining electromechanical frequency responsive devices.

I claim:

1. A process for making an electromechanical frequency responsive device having a vibrating member and supporting and actuating portions, including the steps of: providing a sheet of metal having a thin cross-section, forming a first pattern of resist on one side of the sheet corresponding to the configuration of the device, forming a second pattern of resist on the other side of the sheet corresponding to the supporting and actuating portions and exposing one side of the vibrating member, etching in a single step the exposed metal to form the device and to reduce the thickness of the vibrating member to less than the thickness of said supporting portion, thereby relieving the stresses therein, and washing to remove the resist.

2. The process of claim 1 wherein etching away the exposed metal forms fillets between the vibrating member and that part of the device having a greater cross-section.

References Cited

UNITED STATES PATENTS

| | | | |
|---|---|---|---|
| 2,710,791 | 6/1955 | Gaul | 156—7 |
| 3,174,920 | 3/1965 | Post | 156—8 |
| 3,358,363 | 12/1967 | Jacks et al. | 156—8 XR |

JACOB H. STEINBERG, Primary Examiner

U.S. Cl. X.R.

325—252